United States Patent
Yeh et al.

(10) Patent No.: US 8,268,085 B2
(45) Date of Patent: Sep. 18, 2012

(54) METHODS FOR FORMING METAL GATE TRANSISTORS

(75) Inventors: Matt Yeh, Hsinchu (TW); Shun Wu Lin, Taichung (TW); Hui Ouyang, Chubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 179 days.

(21) Appl. No.: 12/719,532

(22) Filed: Mar. 8, 2010

(65) Prior Publication Data

US 2010/0240204 A1 Sep. 23, 2010

Related U.S. Application Data

(60) Provisional application No. 61/162,065, filed on Mar. 20, 2009.

(51) Int. Cl.
*B08B 3/04* (2006.01)
(52) U.S. Cl. ............ 134/26; 134/1; 134/2; 134/21; 134/30; 134/32; 134/33; 134/34; 134/35; 134/36; 134/42; 134/902; 438/906; 257/E21.224

(58) Field of Classification Search .............. 134/1, 2, 134/21, 26, 30, 32, 33, 34, 35, 36, 42, 902; 438/906; 257/E21.224
See application file for complete search history.

(56) References Cited

U.S. PATENT DOCUMENTS

| | | | |
|---|---|---|---|
| 6,319,330 B1 * | 11/2001 | Jiang et al. | 134/2 |
| 7,435,301 B2 * | 10/2008 | Mun et al. | 134/2 |
| 2001/0029104 A1 * | 10/2001 | Aoki | 438/692 |
| 2002/0189643 A1 * | 12/2002 | Chen et al. | 134/6 |
| 2006/0260647 A1 * | 11/2006 | Verhaverbeke et al. | 134/2 |

* cited by examiner

*Primary Examiner* — Bibi Carrillo
(74) *Attorney, Agent, or Firm* — Lowe Hauptman Ham & Berner, LLP (57) ABSTRACT

A method for cleaning a diffusion barrier over a gate dielectric of a metal-gate transistor over a substrate is provided. The method includes cleaning the diffusion barrier with a first solution including at least one surfactant. The amount of the surfactant of the first solution is about a critical micelle concentration (CMC) or more. The diffusion barrier is cleaned with a second solution. The second solution has a physical force to remove particles over the diffusion barrier. The second solution is substantially free from interacting with the diffusion barrier.

17 Claims, 10 Drawing Sheets

METHODS FOR FORMING METAL GATE TRANSISTORS

CROSS-REFERENCES TO RELATED APPLICATIONS

The present application is based on, and claims priority from, U.S. Provisional Patent Application No. 61/162,065 filed Mar. 20, 2009, the disclosure of which is hereby incorporated by reference herein in its entirety.

TECHNICAL FIELD

The present disclosure relates generally to the field of semiconductor devices, and more particularly, to methods for forming metal gate transistors.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. Conventionally, a diffusion barrier is formed between the gate dielectric and the metal gate electrode to prevent metallic ions from diffusing into and damaging the gate dielectric.

SUMMARY

In one embodiment, a method for cleaning a diffusion barrier over a gate dielectric of a metal-gate transistor over a substrate is provided. The method includes cleaning the diffusion barrier with a first solution including at least one surfactant. The amount of the surfactant of the first solution is about a critical micelle concentration (CMC) or more. The diffusion barrier is cleaned with a second solution. The second solution has a physical force to remove particles over the diffusion barrier. The second solution is substantially free from interacting with the diffusion barrier.

In another embodiment, a method for forming a metal-gate transistor is provided. The method includes forming a dummy gate over a diffusion barrier over a gate dielectric over a substrate, an insulating dielectric being around the dummy gate, at least one doped region being adjacent to the dummy gate. The dummy gate is removed to expose the diffusion barrier. The diffusion barrier is cleaned with a first solution including at least one surfactant, the amount of the surfactant of the first solution being about a critical micelle concentration (CMC) or more. The diffusion barrier is cleaned with a second solution, the second solution having a physical force to remove particles over the gate dielectric, wherein the second solution is substantially free from interacting with the diffusion barrier. Thereafter, a metal gate layer is formed over the diffusion barrier.

These and other embodiments of the present disclosure, as well as its features are described in more detail in conjunction with the text below and attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

The conventional diffusion barrier has metallic materials. If conventional cleaning processes (SC1 and SC2) are applied to clean the diffusion barrier before the deposition of the metal gate layer, it is found that particles are formed after the formations of the diffusion barrier and the metal gate layer. The SC1 process includes a mixture of $NH_4OH$, $H_2O_2$, and $H_2O$ and the SC2 process includes a mixture of $HCl$, $H_2O_2$, and $H_2O$. It is found that the chemicals of the SC1 and SC2 processes interact with the metallic diffusion barrier to form the particles. The particles may be small. However, the following deposition of the metal gate layer can enhance the particles. The particles can be referred to as metal hump defects. If multiple metal gate layers are formed over the diffusion barrier, the issue of the metal hump defect can be even worse.

From the foregoing, methods for forming metal-gate transistors are desired.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the application relate to methods for cleaning a diffusion barrier by solutions that are substantially free from interacting with the diffusion barrier. In one embodiment, the method can include cleaning the diffusion barrier with a first solution with at least one surfactant that can desirably remove organic residues and/or polymer and cleaning the diffusion barrier with a second solution providing a physical force to remove particles.

Figure 1:
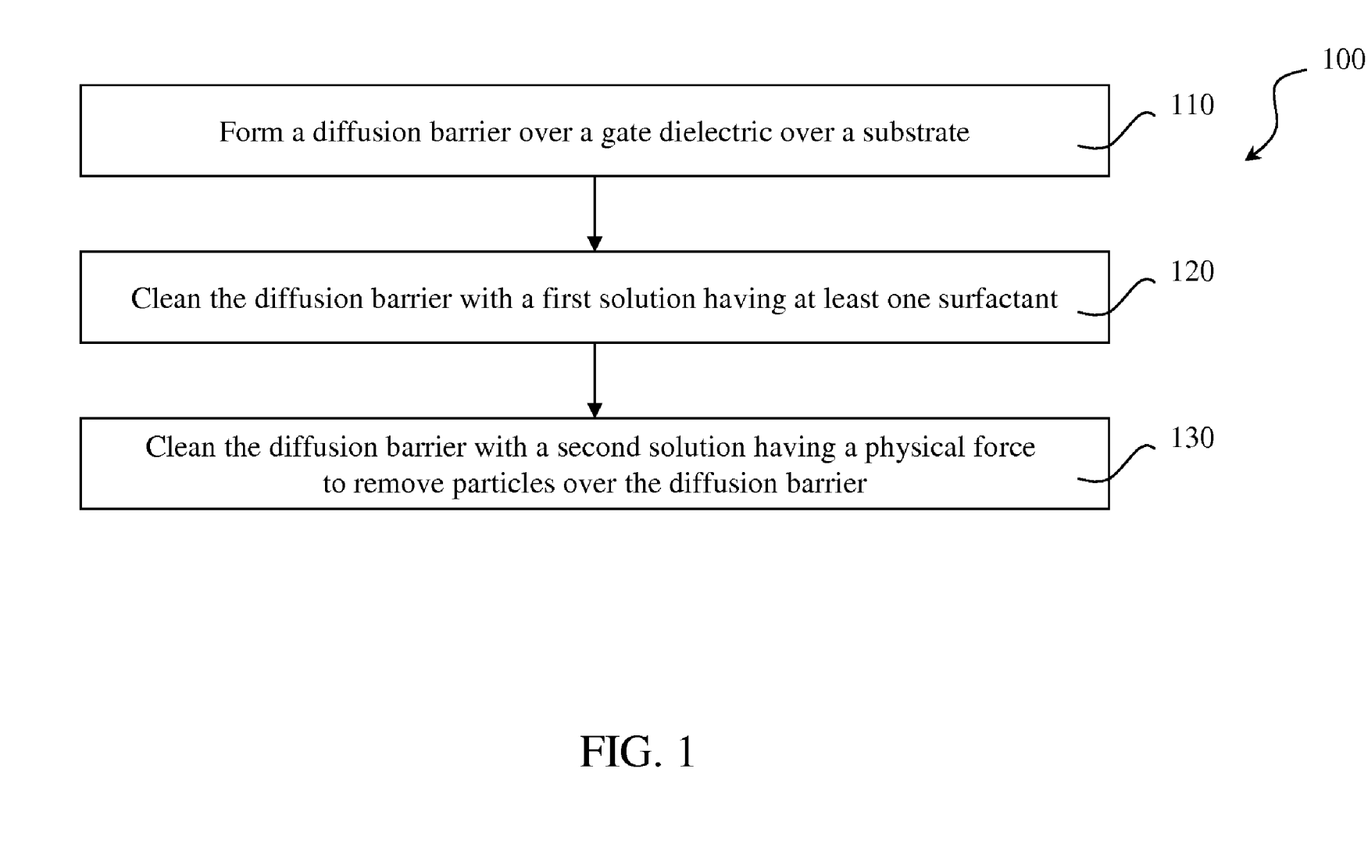
FIG. 1 is a schematic drawing showing an exemplary flowchart for cleaning a diffusion barrier over a gate dielectric of a metal gate transistor.

FIG. 1 is a schematic drawing showing an exemplary flowchart for cleaning a diffusion barrier over a gate dielectric of a metal gate transistor. In FIG. 1, a diffusion barrier is formed over a gate dielectric (step 110). The diffusion barrier can be cleaned with a first solution having at least one surfactant (step 120). The diffusion barrier can be cleaned with a second solution having a physical force to remove particles over the diffusion barrier (step 130). In some embodiments, the diffusion barrier can include metallic materials, such as titanium nitride, tantalum nitride, or other materials that are capable of preventing diffusion of metallic ions of a metal gate layer into the gate dielectric. The diffusion barrier can be referred to as a metal cap layer.

Referring to FIG. 1, step 120 can use the first solution, including at least one surfactant, to clean the diffusion barrier. The first solution can be a mixture of deionized water, the surfactant, and other chemicals that is substantially free from interacting with the diffusion barrier. The amount of the surfactant of the first solution can be about a critical micelle concentration (CMC) or more, such that the surfactant can spontaneously aggregate to form micelles. In some embodiments, the amount of the surfactant can be from about 0.0001 wt. % to about 1 wt. %. In other embodiments, the amount of the surfactant can be about 0.01 wt %. The micelles can trap particles, such as organic residues and/or polymer over the diffusion barrier. In some embodiments, the surfactant can include at least one surfactant comprising a cationic surfactant (e.g., quaternary amine salt and/or other cationic surfactant having a hydrophilic group with positive charges), anionic surfactant (e.g., carboxylic salt, sulfonic salt, and/or other anionic surfactant having a hydrophilic group with negative charges), amphiphilic surfactant (e.g., amino acid and/or other amphiphilic surfactant having a hydrophilic group with zwitterions), non-ionic surfactant (e.g., poly(propylene.oxide)-poly(ethylene oxide) (PPO-PEO) and other non-ionic surfactant without charges), or any combinations thereof. Following are exemplary formulas of the surfactant.

In some embodiments, step 120 can be performed in a single wafer wet cleaning system, a wet bench, other wet cleaning system, and/or combinations thereof. In embodiments using a single wafer wet cleaning system, step 120 can include dispersing the first solution having a flow rate of the first solution from about 0.5 liter/minute to about 4 liter/minute. In other embodiments, the flow rate of the first solution can be about 2 liter/minute. The substrate can be rotated at a speed between about 500 revolutions per minute (RPM) and about 800 RPM. Step 120 can be performed at a room temperature between about 23° C. and about 25° C. One of skill in the art is able to modify the conditions of step 120 to remove polymer and/or organic residues over the diffusion barrier.

In step 130, the diffusion barrier can be cleaned by the second solution having a physical force to remove particles over the diffusion barrier. The second solution can include deionized water and/or other chemicals that are substantially free from interacting with the diffusion barrier. The physical force can remove particles such as oxide, nitride, silicon defects, and/or other particles. In some embodiments, step 130 can be performed in a nano-spray cleaning system, spray cleaning system, ultrasonic vibration system, other cleaning system that can generate a desired physical force to remove the particles and be substantially free from damaging the diffusion barrier, and/or combinations thereof. In embodiments using a nano-spray cleaning system, step 130 can include providing the second solution, such as deionized water, having a flow rate between about 40 cc/minute and about 200 cc/minute, injecting an inert gas having a flow rate from about 10 liter/minute to about 100 liter/minute into the deionized water, and rotating the substrate at a speed between about 300 RPM and about 1,000 RPM. The inert gas can include nitrogen, noble gas, and/or combinations thereof. In other embodiments, the second solution can have a flow rate of about 100 cc/minute, the inert gas can have a flow rate of about 30 liter/minute, and the substrate can be rotated at a speed between about 500 RPM and about 800 RPM. Step 130 can be performed at a room temperature between about 23° C. and about 25° C. One of skill in the art is able to modify the conditions of step 120 to desirably remove polymer and/or organic residues over the diffusion barrier.

It is noted that the steps 120 and 130 can be exchanged and/or multiply applied to clean the diffusion barrier. In some embodiments, the steps 120 and 130 can be performed within a single process. For example, the first solution including the surfactant can provide a desired physical force to remove the organic residues and particles. In other embodiments, the cleaning steps 120 and 130 are free from including a chemical such as acid (e.g., HCl) or base (e.g., $NH_4OH$) that may interact with the diffusion barrier. In still other embodiments, the diffusion barrier is free from being subjected to a SC1 process and/or a SC2 process.

It is also noted that the first and second solutions applied to clean the diffusion barrier are substantially free from interacting with the diffusion barrier. The first solution can desirably remove organic residues or polymer and the second solution can desirably remove particles such as oxide, nitride, and/or silicon defects. The cleaning process described above can clean the diffusion barrier and be free from interacting with the diffusion barrier before depositing a metal gate layer thereover. In some embodiments, the cleaning process can be free from the use of the conventional cleaning solution, such as SC1 and/or SC2. Metal hump defects resulting from the SC1 and SC2 cleaning processes can be desirably reduced.

It is noted that the cleaning process described above in conjunction with FIG. 1 can be applied to processes forming various metal gate transistors, such as gate-first metal gate transistor processes, gate-last metal gate transistor processes, FinFET transistors, other metal gate transistors and/or combinations thereof. The scope of the disclosure is not limited to the exemplary process described below.

Figure 2A:
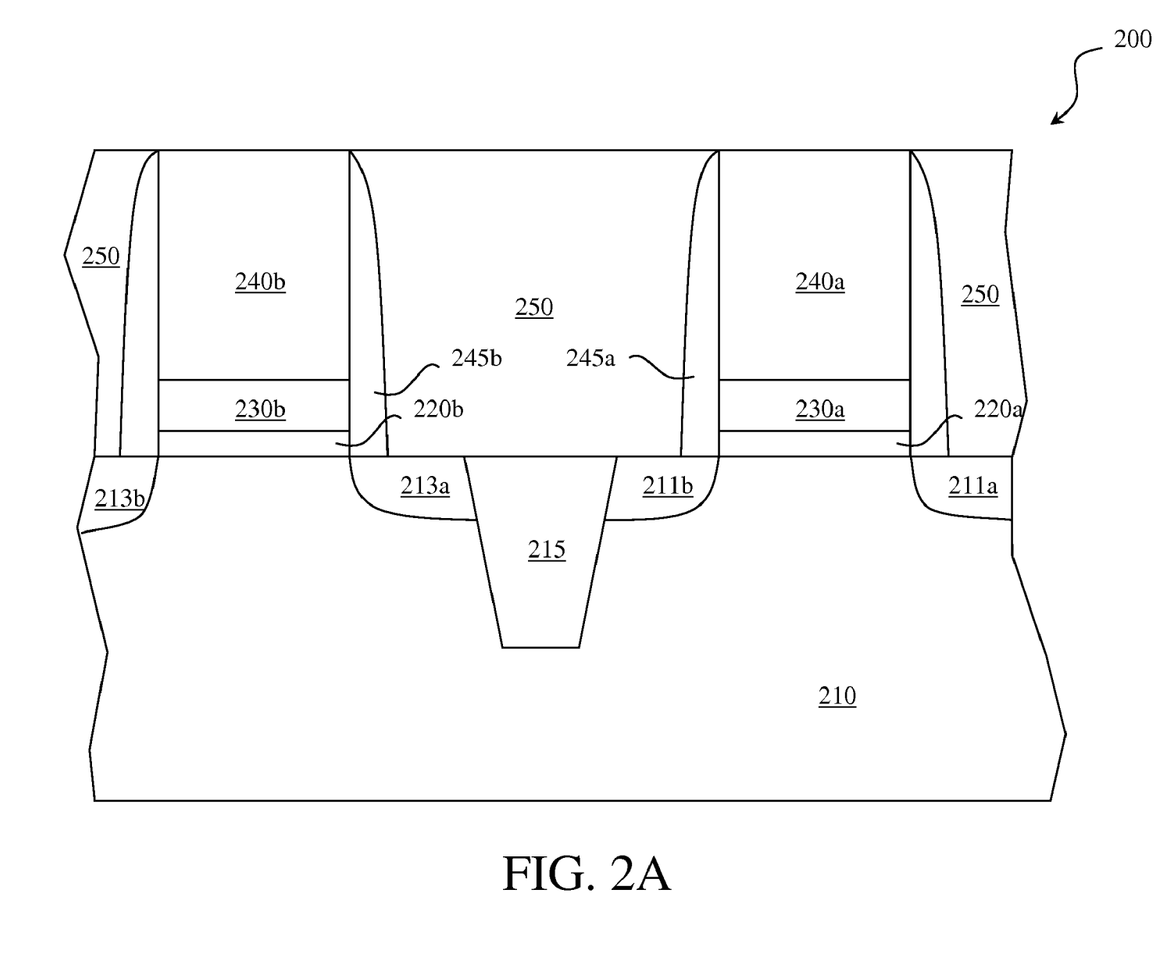
FIGS. 2A-2I are exemplary cross-sectional views illustrating an exemplary process of forming a CMOS metal gate transistor.

Following are descriptions regarding a formation of a gate-last metal gate transistor. FIGS. 2A-2I are exemplary cross-sectional views illustrating an exemplary gate-last process forming a CMOS metal gate transistor. In FIG. 2A, a structure 200 can include an isolation structure 215 within a substrate 210. Gate dielectrics 220a and 220b are formed over the substrate 210. Diffusion barriers 230a and 230b are formed over the gate dielectrics 220a and 220b, respectively. Dummy gates 240a and 240b are formed over the diffusion barriers 230a and 230b, respectively. Spacers 245a and 245b are formed on sidewalls of the dummy gates 240a and 240b, respectively. Doped regions, such as source/drain regions 211a, 211b, 213a and 213b are within the substrate 210 and in proximity to the dummy gates 240a and 240b. An insulating dielectric 250 is around the spacers 245a and 245b and dummy gates 240a and 240b.

In some embodiments, the substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. In still further embodiments, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The isolation structure 215 may be formed within the substrate. The isolation structure 215 may utilize isolation technology, such as local oxidation of silicon (LOCOS) or shallow trench isolation (STI), to define and electrically isolate various active regions of NMOS and PMOS transistors. In the present embodiment, the isolation structure 215 includes an STI. The isolation structure 215 may comprise silicon oxide, silicon nitride, silicon oxynitride, fluoride-doped silicate glass (FSG), a low-K dielectric material, other suitable materials, and/or combinations thereof. In some embodiments, the formation of the isolation structure 215 may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

The doped regions 211a and 211b can be n-type doped regions having dopants such as Arsenic (As), Phosphorus (P), other group V element, or combinations thereof. In some embodiments, the doped regions 211a and 211b can include silicide for low resistances. The doped regions 213a and 213b can be p-type doped regions having dopants such as Boron (B), other group III element, or combinations thereof. In embodiments, the doped regions 213a and 213b can include silicide for low resistances. The doped regions 211a, 211b, 213a, and 213b can be formed directly on the semiconductor substrate, in a P-well structure, in a N-well structure, in a dual-well structure, or using a raised structure. The doped regions 211a, 211b, 213a, 213b are formed by any suitable process, such as ion implantation and/or a rapid thermal process (RTP) to activate the doped regions. In some embodiments, the doped regions 211a, 211b, 213a, 213b may be formed by a plurality of ion implantation processes, such as lightly doped drain (LDD) implant processes and source/drain (S/D) implant processes.

In embodiments, a silicide may be formed in the doped regions 211a, 211b, 213a, and 213b. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using plasma vapor deposition (PVD), such as sputtering and evaporation; plating; chemical vapor deposition (CVD), such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may require a one-step RTP or multiple-step RTPs.

The gate dielectrics 220a and 220b can be a single layer or a multi-layer structure. In some embodiments, the gate dielectric 220a or 220b can include an interfacial layer, e.g., a silicon oxide layer, and a high-k dielectric layer over the silicon oxide layer. In some embodiments, before the interfacial dielectric layer is grown over the substrate 210, an HF-last pre-gate clean (e.g., utilizing an HF solution) and UV process may be performed.

The high-k dielectric layer can be formed over the interfacial dielectric layer. The high-k dielectric layer may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The high-k dielectric layer may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

The diffusion barriers 230a and 230b can be formed over the gate dielectrics 220a and 220b, respectively. The diffusion barriers 230a and 230b can desirably prevent metallic ions of metal gate layers (shown in FIG. 2I) from diffusing into the gate dielectrics 220a and 220b, respectively. The diffusion barriers 230a and/or 230b may comprise aluminum oxide, aluminum, aluminum nitride, titanium, titanium nitride (TiN), tantalum, tantalum nitride, other suitable material, and/or combinations thereof. In some embodiments, the dielectric cap layers 230a, 230b may be formed by any suitable process, such as CVD, PVD, ALD, thermal oxide, plating, and/or combinations thereof. In other embodiments, the diffusion barriers 230a, 230b can have any suitable thickness. It is understood that the diffusion barrier 230a, 230b may be omitted in alternate embodiments.

The dummy gates 240a and 240b can include materials, such as polysilicon, oxide, nitride, oxynitride, and/or other materials that have an etching selectivity different from that of the insulating layer 250. The dummy gates 240a and 240b can be formed, for example, by CVD and/or any suitable processes.

The spacers 245a and 245b can include materials, such as oxide, nitride, oxynitride, other dielectric materials, and/or combinations thereof. The formation of the spacers 245a and 245b can include forming a dielectric layer over the dummy gates 240a, 240b and then etching the dielectric layer to form the spacers 245a and 245b.

In some embodiments, the insulating layer 250 can be formed over the substrate 200 by any suitable process, such as CVD, HDPCVD, spin-on, sputtering, other suitable methods, and/or combinations thereof. The insulating layer 250 can be referred to an interlayer dielectric (ILD). The insulating layer 250 may comprise any suitable material, such as silicon oxide, silicon oxynitride, low-k material, and/or other suitable materials. As illustrated in FIG. 2A, a chemical mechanical polish (CMP) can be performed until the dummy gates 240a and 240b are exposed.

Figure 2B:
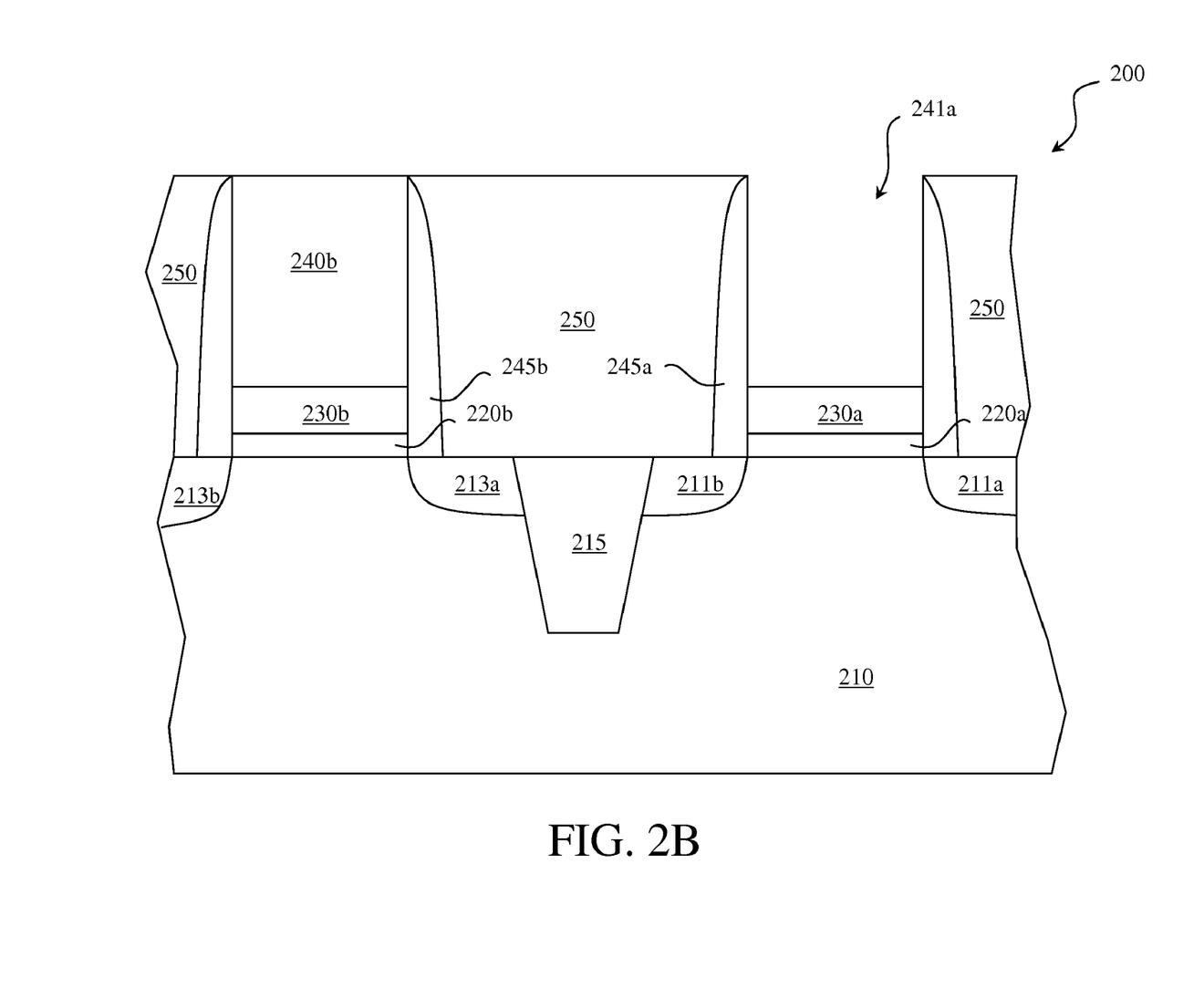

Referring to FIG. 2B, the dummy gate 240a (shown in FIG. 2A) can be removed to form opening 241a exposing the diffusion barrier 230a. A mask layer, such as a hard mask layer and/or a photoresist layer (not shown), can protect the dummy gate 240b from being removed. In some embodiments, removing the dummy gate 240a can include an etching process, such as dry and/or wet etching.

Figure 2C:
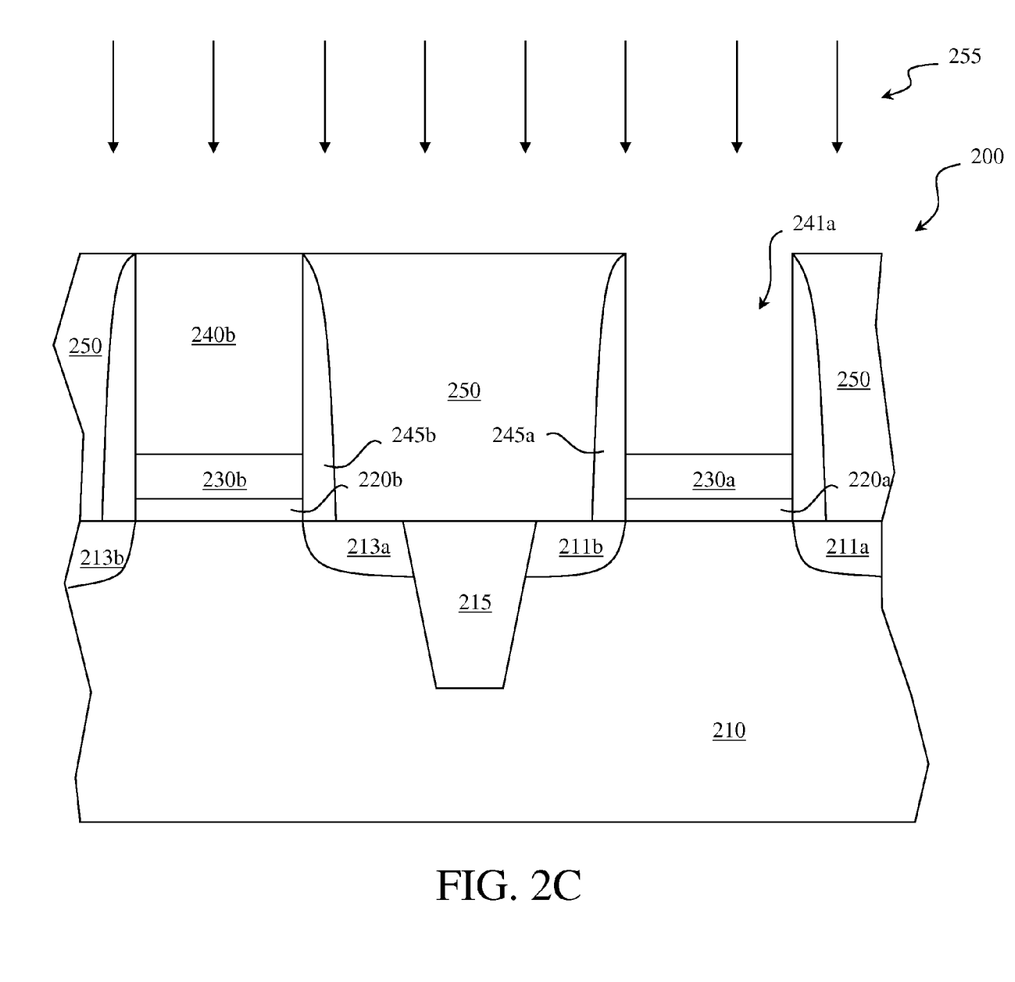

Referring to FIG. 2C, before depositing a metal gate layer, a cleaning process 255 is performed to clean the diffusion barrier 230a for about 60 seconds. In embodiments, the cleaning process 255 is similar to the cleaning step 120 described above in conjunction with FIG. 1. As noted, the cleaning process 255 can desirably remove organic residues and/or polymers.

Figure 2D:
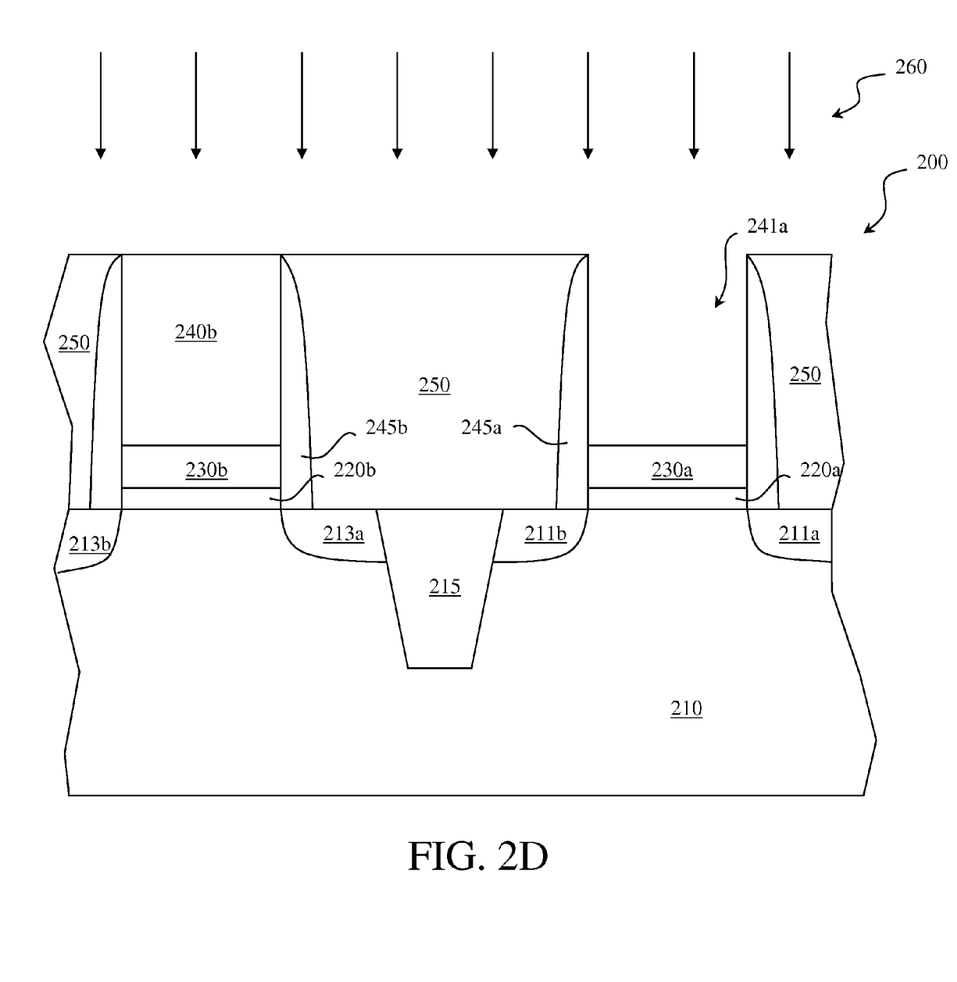

Referring to FIG. 2D, before depositing a metal gate layer, a cleaning process 260 is performed to clean the diffusion barrier 230a for about 60 seconds. In some embodiments, the cleaning process 260 is similar to the cleaning step 130 described above in conjunction with FIG. 1. As noted, the cleaning process 260 can desirably remove particles such as oxide, nitride, oxyniride, silicon, and/other particles. It is noted that the cleaning processes 255 and 260 can be exchanged and/or performed in a single process.

Figure 2E:
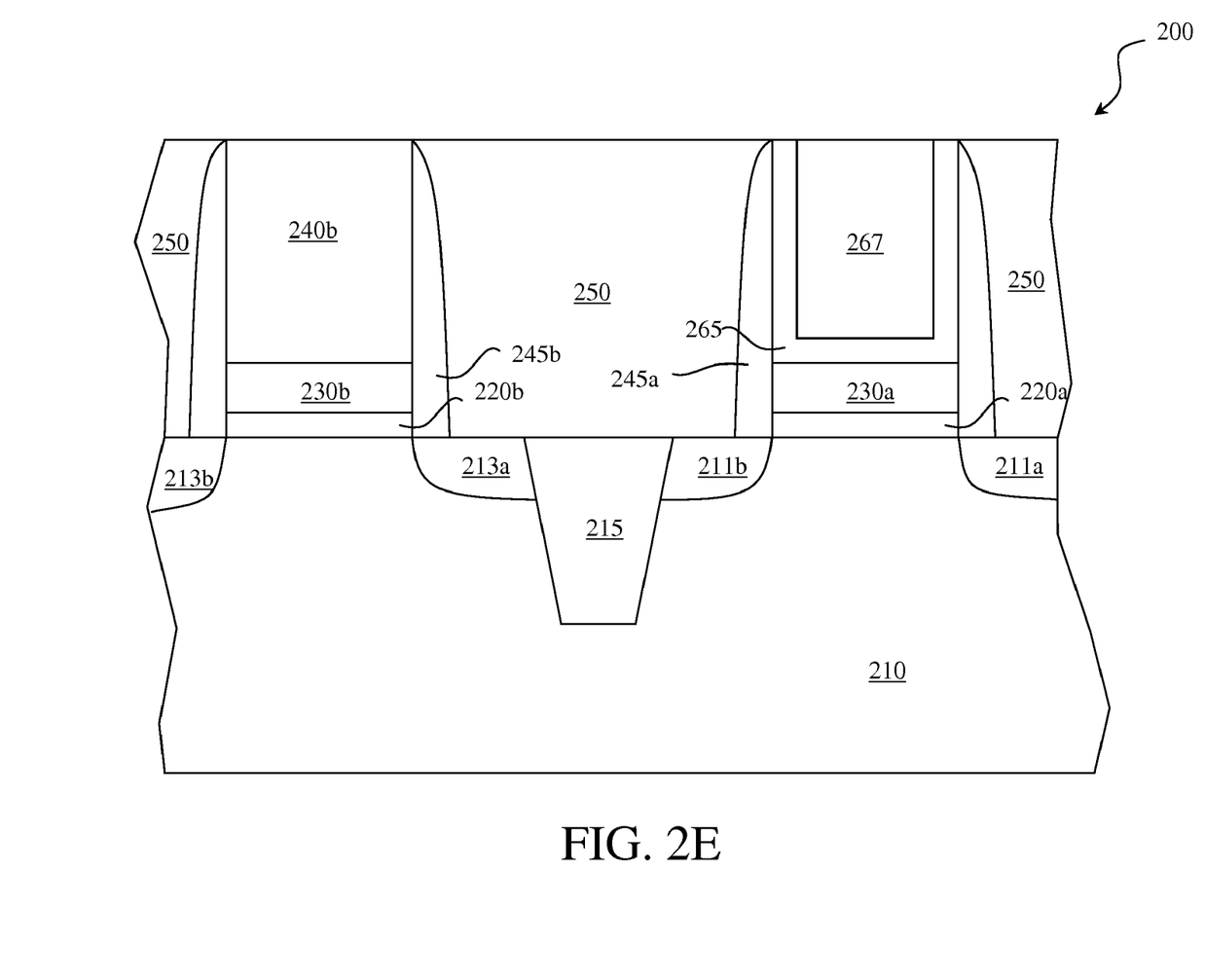

Referring to FIG. 2E, a metal gate layer 265 and a metal bulk 267 can be formed within the opening 241a (shown in FIG. 2D). The metal gate layer 265 can include materials such as metal, metal carbide, metal nitride, or other materials that can provide desired work function for transistors. In embodiments forming an NMOS transistor, the metal gate layer 265 can be an n-type metal gate layer that is capable of providing a work function value of about 4.5 eV or less for the NMOS transistor. The metal gate layer 265 can be formed by any suitable process. For example, the metal gate layer 265 may be formed by deposition, photolithography patterning, etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods, such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof.

The bulk metal 267 can be formed over the metal gate layer 265. The bulk metal 267 may be formed by any suitable processes, such as deposition, photolithography, and etching processes, and/or combinations thereof. In some embodiments, the bulk metal 267 can comprise aluminum deposited by CVD, followed by a CMP. In alternate embodiments, the bulk metal 267 may comprise any suitable material, such as copper, tungsten, titanium, tantulum, titanium nitride, tantalum nitride, nickel silicide, cobalt silicide, other proper conductive materials, and combinations thereof.

Figure 2F:
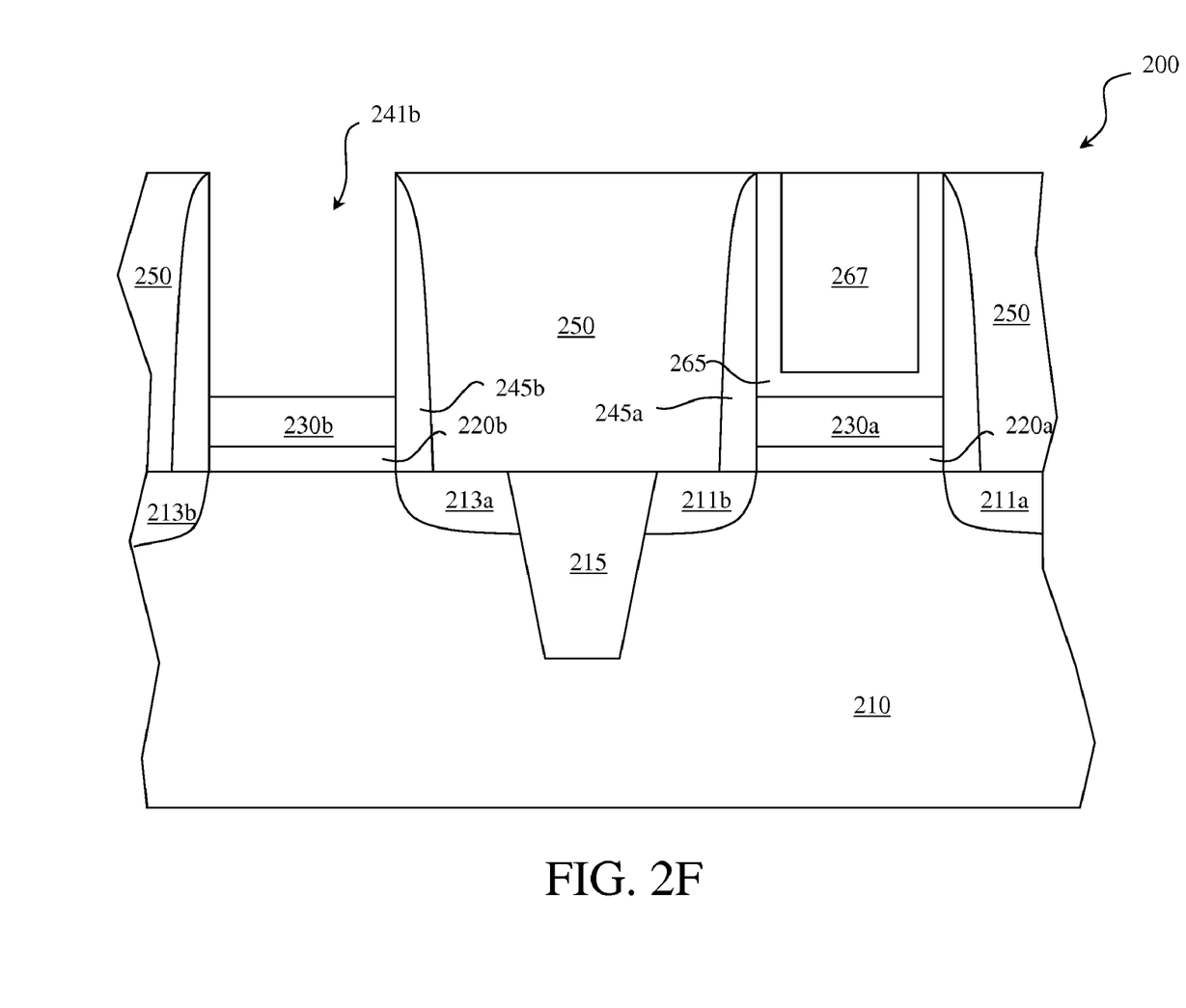

Referring FIG. 2F, the dummy gate 240b (shown in FIG. 2E) can be removed to form opening 241b exposing the diffusion barrier 230b. A mask layer, such as a hard mask layer and/or a photoresist layer (not shown), can protect the metal bulk 267 and the metal gate layer 265 from being removed. In some embodiments, removing the dummy gate 240b can include an etching process, such as dry and/or wet etching.

Figure 2G:
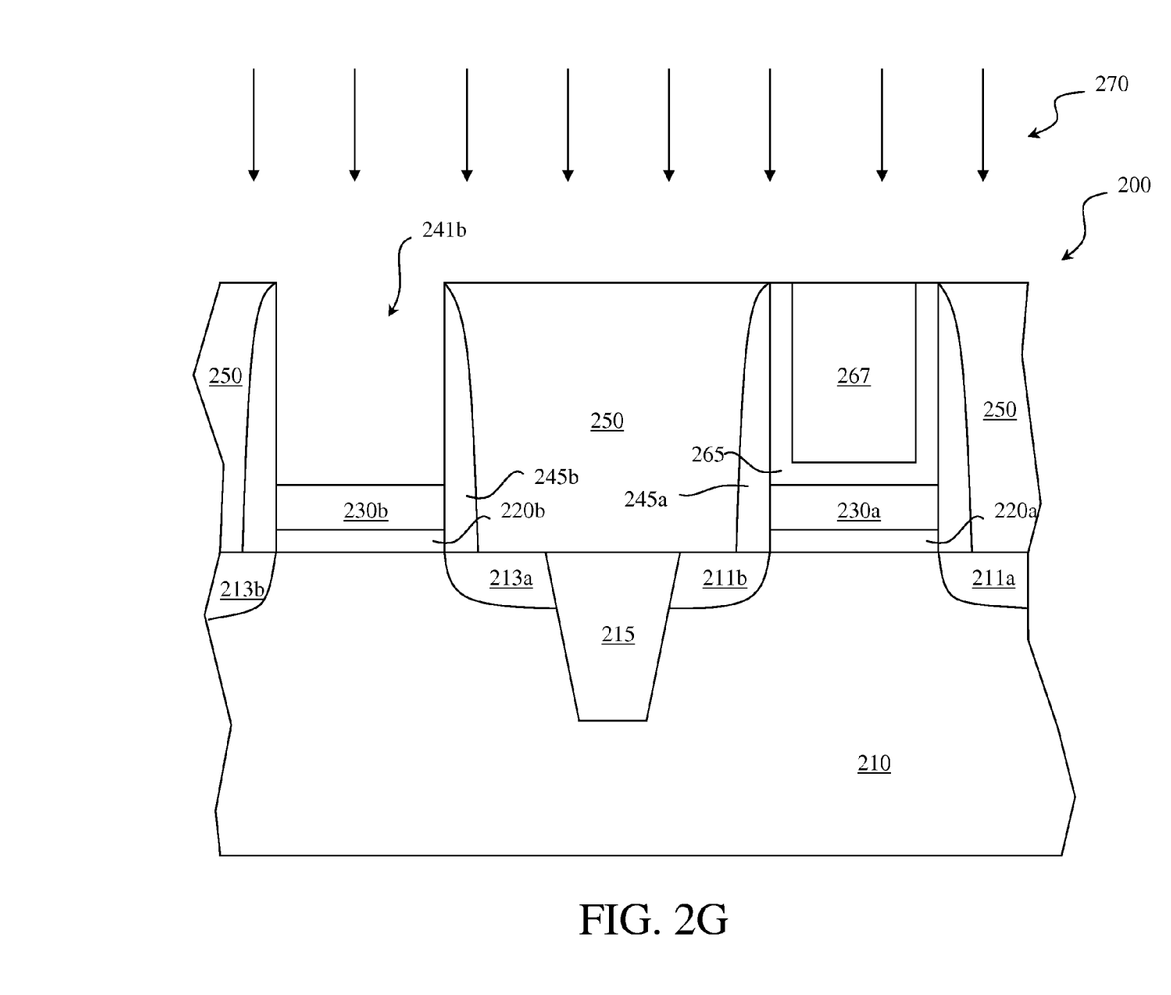

Referring to FIG. 2G, before depositing a metal gate layer, a cleaning process 270 is performed to clean the diffusion barrier 230b for about 60 seconds. In some embodiments, the cleaning process 270 is similar to the cleaning step 120 described above in conjunction with FIG. 1. As noted, the cleaning process 270 can desirably remove organic residues and/or polymers.

Figure 2H:
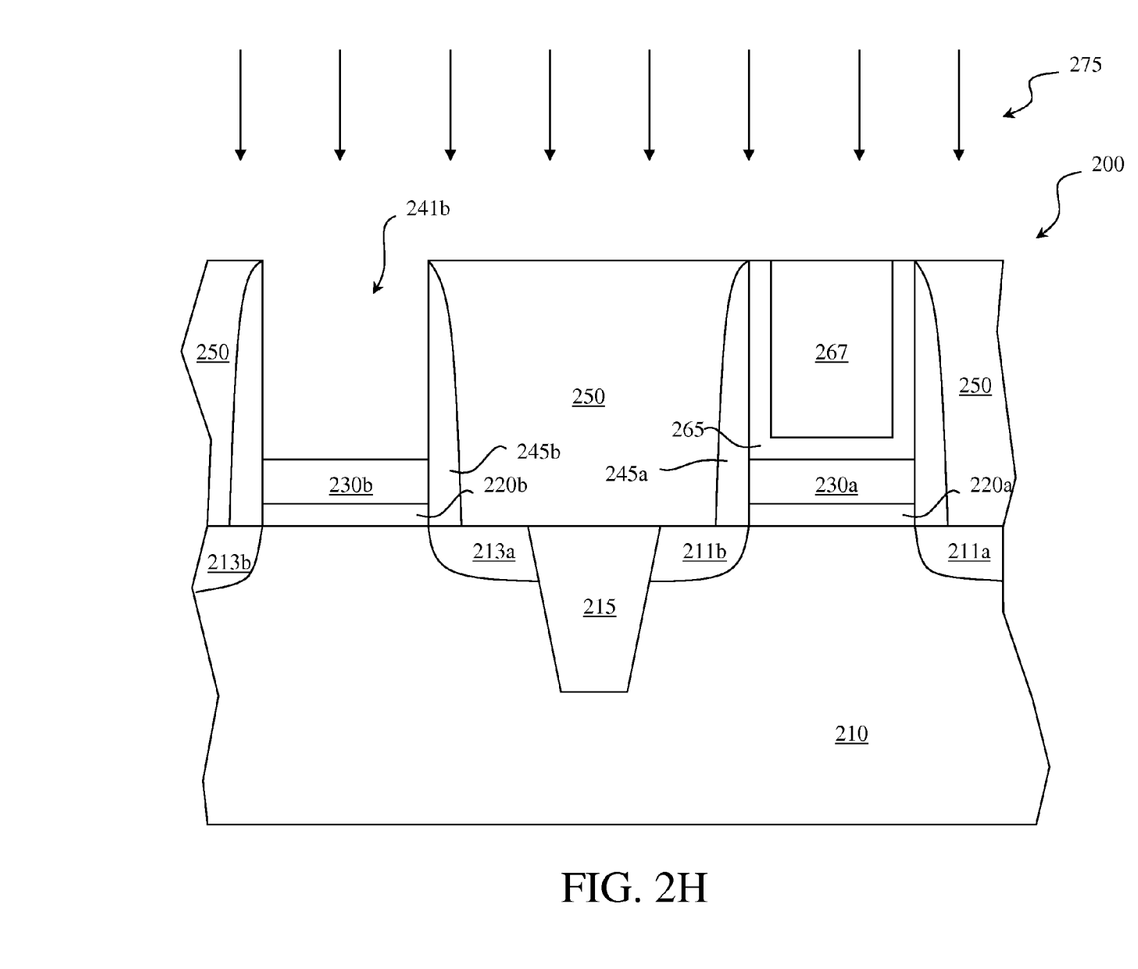

Referring to FIG. 2H, before depositing a metal gate layer, a cleaning process 275 is performed to clean the diffusion barrier 230b for about 60 seconds. In embodiments, the cleaning process 275 is similar to the cleaning step 130 described above in conjunction with FIG. 1. As noted, the cleaning process 275 can desirably remove particles such as oxide, nitride, oxyniride, silicon, and/other particles. It is noted that the cleaning processes 270 and 275 can be exchanged and/or performed in a single process.

Figure 2I:
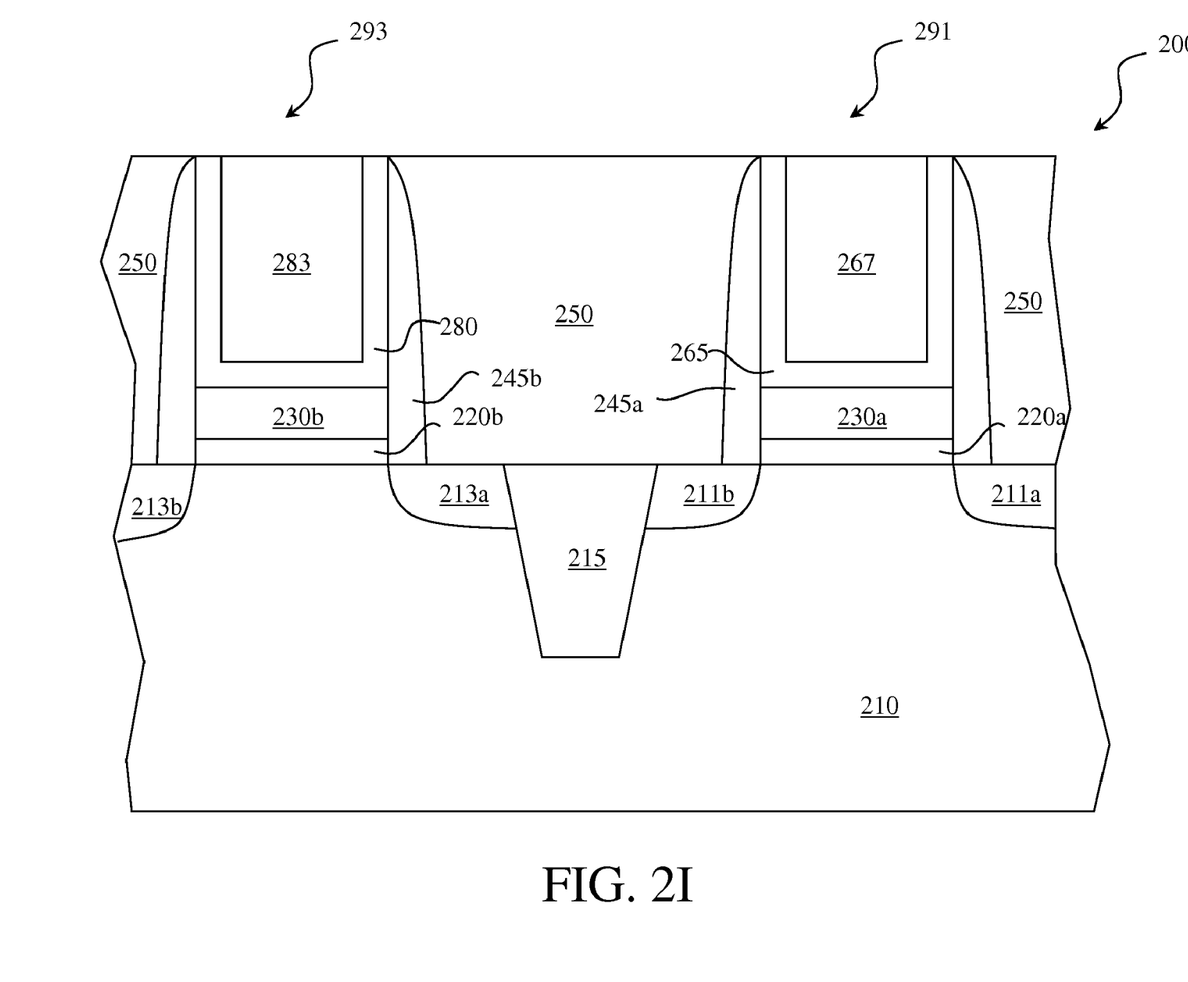

Referring to FIG. 2I, a metal gate layer 280 and a metal bulk 283 can be formed within the opening 241b (shown in FIG. 2H). The metal gate layer 280 can include materials such as metal, metal carbide, metal nitride, or other materials that can provide desired work function for transistors. In embodiments forming a PMOS transistor, the metal gate layer 280 can be a p-type metal gate layer that is capable of providing a work function value of about 4.8 eV or more for the PMOS transistor. The metal gate layer 280 may be formed by any suitable process. For example, the metal gate layer 280 may be formed by conventional deposition, photolithography patterning, etching processes, and/or combinations thereof. The deposition processes may include PVD, CVD, ALD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods, such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof.

The bulk metal 283 can be formed over the metal gate layer 283. The bulk metal 283 may be formed by any suitable processes, such as deposition, photolithography, and etching processes, and/or combinations thereof. In some embodiments, the bulk metal 283 can comprise aluminum deposited by CVD, followed by a CMP. In alternate embodiments, the bulk metal 283 may comprise any suitable material, such as copper, tungsten, titanium, tantalum, titanium nitride, tantalum nitride, nickel silicide, cobalt silicide, other proper conductive materials, and combinations thereof. In embodiments, the cleaning steps 120 and 130 described above in conjunction with FIG. 1 can be performed to clean the metal gate layer 265 and 280 before the formation of the bulk metals 267 and 283.

Referring to FIG. 2I, the structure 200 can include an NMOS transistor 291 and a PMOS transistor 293. It is noted that the sequence for forming the NMOS transistor 291 and the PMOS transistor can be switched. In some embodiments, the metal bulks 267 and 283 can be formed by the same process and have the same material. One of skill in the art can desirably modify the exemplary processes described above to form the metal gate transistors.

It is understood that the structure 200 may undergo further CMOS or MOS technology processing to form various features known in the art. In still another example, various contacts/vias and multilayer interconnect features (e.g., metal layers and interlayer dielectrics) may be formed on the substrate 210 and configured to connect the various features or structures of the structure 200.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning a diffusion barrier over a gate dielectric of a metal-gate transistor over a substrate, the method comprising:
    cleaning the diffusion barrier using a first solution including at least one surfactant, an amount of the surfactant of the first solution being about a critical micelle concentration (CMC) or more; and
    cleaning the diffusion barrier with a second solution, the second solution having a physical force to remove particles over the diffusion barrier, wherein the second solution is substantially free from interacting with the diffusion barrier.

2. The method of claim 1, wherein the first solution and the second solution are the same solution.

3. The method of claim 1, wherein cleaning the diffusion barrier using the first solution is capable of removing at least one of organic residues and polymers.

4. The method of claim 1, wherein the surfactant is selected from a group consisting of a cationic surfactant, anionic surfactant, amphiphilic surfactant, non-ionic surfactant, and any combinations thereof.

5. The method of claim 1, wherein the amount of the surfactant is between about 0.0001 wt. % and about 1 wt. %.

6. The method of claim 1, wherein cleaning the diffusion barrier with the first solution comprises:
    dispersing the first solution at a flow rate from about 0.5 liter/minute to about 4 liter/minute; and
    rotating the substrate at a speed from about 500 RPM to about 800 RPM.

7. The method of claim 1, wherein cleaning the diffusion barrier with the second solution comprises a spray clean, an ultrasonic clean, or combinations thereof.

8. The method of claim 1, wherein the diffusion barrier is free from being subjected to at least one of a standard clean 1 (SC1) process and a standard clean 2 (SC2) process.

9. The method of claim 7, wherein the spray clean comprises:
    providing a deionized water having a flow rate from about 40 cc/minute to about 200 cc/minute;
    injecting an inert gas having a flow rate between about 10 liter/minute and about 100 liter/minute into the deionized water to form the second solution to generate the physical force to remove the particles; and
    rotating the substrate at a speed from about 500 RPM to about 1,000 RPM.

10. The method of claim 8, wherein the surfactant is selected from a group consisting of a cationic surfactant, anionic surfactant, amphiphilic surfactant, non-ionic surfactant, and any combinations thereof.

11. The method of claim 8, wherein the amount of the surfactant is between about 0.0001 wt. % and about 1 wt. %.

12. The method of claim 8, wherein cleaning the diffusion barrier with the first solution comprises:
    dispersing the first solution at a rate from about 0.5 liter/minute to about 4 liter/minute; and
    rotating the substrate at a speed from about 500 RPM to about 800 RPM.

13. The method of claim 8, wherein cleaning the diffusion barrier with the second solution comprises a spray clean process, an ultrasonic clean process, or combinations thereof.

14. The method of claim 8, wherein the first solution and the second solution are the same solution.

15. The method of claim 8, wherein cleaning the diffusion barrier using the first solution is capable of removing at least one of organic residues and polymers.

16. The method of claim 9, wherein the diffusion barrier is free from being subjected to at least one of a standard clean 1 (SC1) process and a standard clean 2 (SC2) process.

17. The method of claim 13, wherein the spray clean comprises:
    providing a deionized water having a flow rate from about 40 cc/minute to about 200 cc/minute;
    injecting an inert gas having a flow rate between about 10 liter/minute and about 100 liter/minute into the deionized water to form the second solution to generate the physical force to remove the particles; and
    rotating the substrate at a speed from about 500 RPM to about 1,000 RPM.

* * * * *